United States Patent
Shankar et al.

(10) Patent No.: US 12,046,275 B2
(45) Date of Patent: Jul. 23, 2024

(54) SYSTEM AND METHOD FOR SELECTIVE STATIC RANDOM-ACCESS MEMORY PARTITION INITIALIZATION

(71) Applicant: TEXAS INSTRUMENTS INCORPORATED, Dallas, TX (US)

(72) Inventors: Ruchi Shankar, Bengaluru (IN); Shobhit Singhal, Bengaluru (IN); Sverre Brubæk, Oslo (NO); Praveen Kumar Narayanan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 186 days.

(21) Appl. No.: 17/558,176

(22) Filed: Dec. 21, 2021

(65) Prior Publication Data

US 2023/0197143 A1 Jun. 22, 2023

(51) Int. Cl.
 *G06F 9/445* (2018.01)
 *G11C 11/412* (2006.01)
 *G11C 11/419* (2006.01)
 *G11C 11/418* (2006.01)

(52) U.S. Cl.
 CPC .......... *G11C 11/412* (2013.01); *G11C 11/419* (2013.01); *G11C 11/418* (2013.01)

(58) Field of Classification Search
 CPC .... G11C 11/412; G11C 11/419; G11C 11/418
 See application file for complete search history.

(56) References Cited

U.S. PATENT DOCUMENTS

| 5,960,195 | A  | * | 9/1999 | Kang | G06F 1/24 |
| | | | | | 713/1 |
| 2003/0018862 | A1 | * | 1/2003 | Karnstedt | G06F 5/065 |
| | | | | | 711/156 |
| 2003/0063513 | A1 | * | 4/2003 | Tsunoda | G11C 5/146 |
| | | | | | 365/230.03 |
| 2005/0102660 | A1 | * | 5/2005 | Chen | G06F 8/65 |
| | | | | | 717/174 |
| 2008/0209117 | A1 | * | 8/2008 | Kajigaya | G06F 12/1433 |
| | | | | | 711/E12.001 |
| 2019/0347045 | A1 | * | 11/2019 | Gschwind | G06F 3/0604 |
| 2022/0013166 | A1 | * | 1/2022 | Schmidt | G11C 11/418 |

* cited by examiner

*Primary Examiner* — Min Huang
(74) *Attorney, Agent, or Firm* — Brian D. Graham; Frank D. Cimino; Xianghui Huang

(57) ABSTRACT

A static random-access memory (SRAM) includes a SRAM cell module, comprising a plurality of SRAM cell partitions, and an initialization register, containing data configured to control initialization of at least some of the plurality of partitions during an initialization phase. The SRAM also includes a control module coupled with the SRAM cell module and the initialization register, configured to read the initialization register during the initialization phase, and to selectively initialize a portion of the plurality of SRAM cell partitions, based at least in part on the data contained within the initialization register.

22 Claims, 4 Drawing Sheets

SYSTEM AND METHOD FOR SELECTIVE STATIC RANDOM-ACCESS MEMORY PARTITION INITIALIZATION

BACKGROUND

Many microcontroller units (MCUs) include static random-access memories (SRAMs) with additional error correction code (ECC) or parity bits. This enables the MCU to implement a safe state for safety mode operation. Upon power up, memory arrays usually contain random data along with ECC or parity bits that are not consistent with the random data (since they are also random and have not been generated based on the data). This inconsistency leads to parity or ECC errors if any attempt is made to read the memory. In order to avoid these errors, typically during boot-up of the MCU, memories are fully initialized with a known pattern of data (including ECC or parity bits) via hardware within the MCU.

Some applications require specific data to be preserved in memory during a warm reboot caused by events such as a watchdog triggered reset. However, during reboot the memory is initialized, resulting in the loss of all data within the memory. In order to preserve this data, some embodiments include non-volatile memory (such as flash memory) for storage of the required data along with temporary storage of state variables in SRAM. In the event of an unexpected reset of the MCU, these state variables are of use in recovering the application. Currently, some MCUs provide limited registers in an always-on domain for storage of these state variables. However, always-on domains are expensive both in terms of area and in current leakage.

SUMMARY

In an implementation, a static random-access memory (SRAM) includes a SRAM cell module, comprising a plurality of SRAM cell partitions, and an initialization register, containing data configured to control initialization of at least some of the plurality of partitions during an initialization phase. The SRAM also includes a control module coupled with the SRAM cell module and the initialization register, configured to read the initialization register during the initialization phase, and to selectively initialize a portion of the plurality of SRAM cell partitions, based at least in part on the data contained within the initialization register.

In another implementation, a method for initializing a static random-access memory (SRAM) comprising a plurality of SRAM cell partitions includes reading an initialization register containing data configured to control initialization of at least some of the plurality of SRAM cell partitions and selectively initializing a portion of the plurality of SRAM cell partitions, based at least in part on the data contained within the initialization register.

In a further implementation, a hardware control module for a static random-access memory (SRAM) module comprising a plurality of SRAM cell partitions, is configured to, during an initialization phase, read an initialization register containing data configured to control initialization of at least some of the plurality of SRAM cell partitions, and to selectively initialize a portion of the plurality of SRAM cell partitions, based at least in part on the data contained within the initialization register.

DETAILED DESCRIPTION

Static RAMs have the ability to retain their data without requiring periodic refreshing of the data as is required by dynamic RAMs. Also, SRAMs are capable of retaining data during brief power cycles such as occur during a warm reboot. However, some data may be corrupted, and the longer the SRAM is without power, the higher the likelihood that data will be lost.

During a warm reboot with a brief interruption of power to the SRAM array, it is possible to retain data within the SRAM. In order to preserve this data within the SRAM array, initialization of the SRAM during boot-up must be modified. By enabling a user to select partitions within an SRAM array that are not to be initialized upon boot-up, data may be preserved within those selected partitions.

Figure 1:
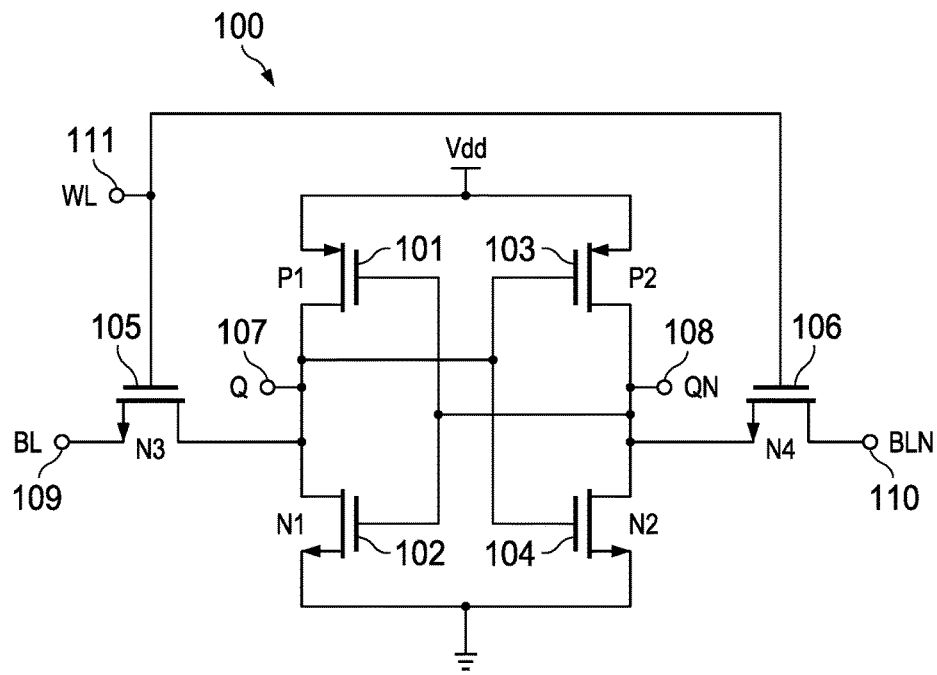
FIG. 1 illustrates an example embodiment of a static random-access memory cell.

FIG. 1 illustrates an example six-transistor SRAM cell 100 as used within various embodiments of the present invention. A variety of other SRAM cell designs are used in other embodiments, all within the scope of the present invention. This SRAM cell 100 comprises two cross-coupled complementary metal-oxide-semiconductor (CMOS) inverters for storing data. These two cross-coupled CMOS inverters are composed of transistors P1 101 and N1 102 forming a first CMOS inverter, and transistors P2 103 and N2 104 forming a second CMOS inverter. They are powered by power supply Vdd and include a connection to ground.

Together these cross-coupled inverters store data Q 107 and QN 108 (QN 108 is the inverse of Q 107). Reading and writing the data Q 107 and QN 108 is accomplished through a pair of n-type metal-oxide-semiconductor (NMOS) transfer gates N3 105 and N4 106. Other embodiments use other designs, such as full complementary transfer gates, all within the scope of the present invention. These transfer gates are controlled by word line WL 111. When WL 111 is high, the NMOS transfer gates are activated and data within the SRAM cell may be read or written on bit lines BL 109 and BLN 110. BL 109 is coupled with data Q 107 through NMOS transfer gate N3 105, while BLN 110 is coupled with data QN 108 through NMOS transfer gate N4 106.

BL 109 and BLN 110 act as inputs during write operations and as outputs during read operations. During a read operation, word line WL 111 is activated and bit lines BL 109 and BLN 110 are pre-charged. While the two NMOS transfer gates N3 105 and N4 106 are active, Q 107 is coupled with BL 109 and QN 108 is coupled with BLN 110. This results in voltage changes on BL 109 and BLN 110 which are detected by sense amplifiers (illustrated in FIG. 2) to determine the value of Q 107 within SRAM cell 100.

During a write operation, new data values for Q 107 and QN 108 are applied to BL 109 and BLN 110 respectively. Word line WL 111 is then activated, which causes NMOS transmission gates N3 105 and N4 106 to couple BL 109 to Q 107 and BLN 110 to QN 108. The voltages on BL 109 and BLN 110 overwrite the previous data stored on Q 107 and QN 108, thus storing the new data value within SRAM cell 110 once WL 111 is deactivated, shutting off the NMOS transmission gates N3 105 and N4 106 and isolating Q 107 from BL 109 and QN 108 from BLN 110.

Figure 2:
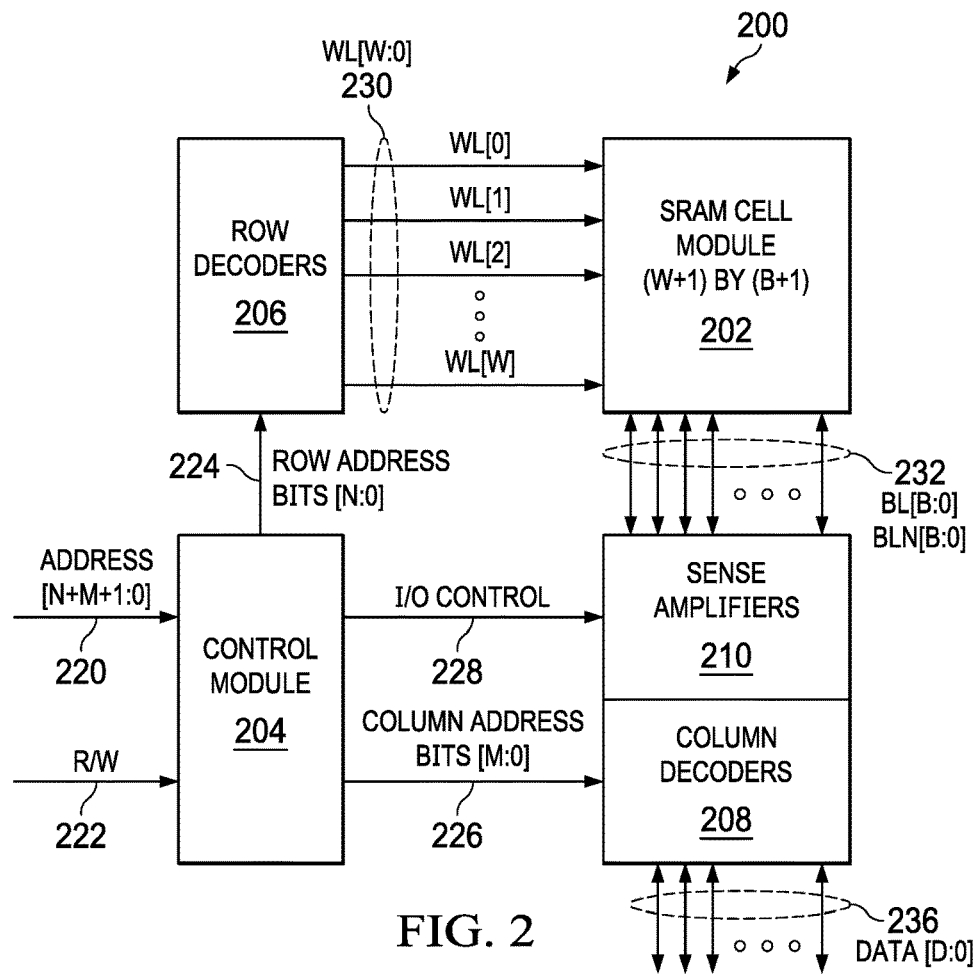
FIG. 2 illustrates a block diagram of an example embodiment of a static random-access memory.

FIG. 2 illustrates a block diagram of an example embodiment of a static random-access memory 200. In this simplified block diagram of a SRAM 200, such as used within various embodiments of the present invention, a SRAM cell module 202 comprises an array of SRAM cells such as the six-transistor cell 100 illustrated in FIG. 1.

In this example embodiment, SRAM cell module 202 comprises an array of (W+1) by (B+1) SRAM cells 100. W+1 is the number of word lines and B+1 is the number of bit lines within the array 202. Word lines WL[W:0] 230 are provided to SRAM cell module 202 by a plurality of row decoders 206, while bit lines BL[B:0] and BLN[B:0] 232 are provided to SRAM cell module 202 by a plurality of column decoders 208.

A plurality of sense amplifiers 210 are provided to read data appearing on bit lines BL[B:0] and BLN[B:0] 232 during read operations, as discussed above with respect to FIG. 1. Data[D:0] 236 is provided at the outputs of sense amplifiers 210 during read operations, and provided to bit lines BL[B:0] and BLN[B:0] 232 through column decoders 208 during write operations.

Row decoders 206, column decoders 208 and sense amplifiers 210 are controlled by control module 204. In this example embodiment, control module 204 receives address bits Address[N+M+1:0] 220 and read/write control signal 222, and divides address bits Address[N+M+1:0] 220 into Row Address Bits[N:0] 224 and Column Address Bits[M:0] 226 which are provided to row decoders 206 and column decoders 208 respectively. Control module 204 also provides I/O control 228 to sense amplifiers 210.

Figure 3:
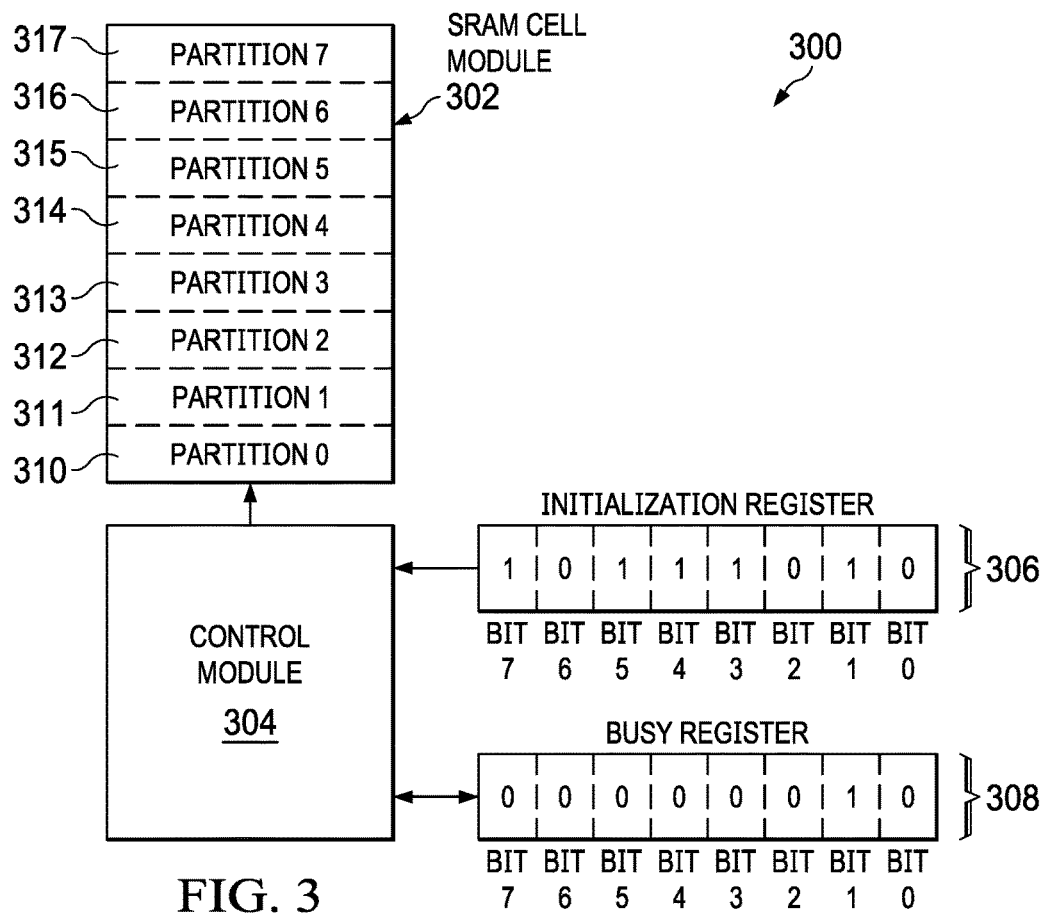
FIG. 3 illustrates a block diagram of an example embodiment of a static random-access memory including selective initialization.

FIG. 3 illustrates a block diagram of an example embodiment of a static random-access memory 300 including selective initialization. In this simplified block diagram, SRAM 300 includes SRAM cell module 302 (similar to SRAM cell module 202 from FIG. 2), control module 304 (similar to control module 204 from FIG. 2), initialization register 306 and busy register 308.

In this example, SRAM cell module 302 comprises a plurality of SRAM cell partitions 310-317 (here, eight partitions), Partition 0 310, Partition 1 311, Partition 2 312, Partition 3 313, Partition 4 314, Partition 5 315, Partition 6 316, and Partition 7 317. Other embodiments provide various sizes of SRAM cell modules and various numbers of partitions, all within the scope of the present invention.

In this example embodiment, initialization register 306 and busy register 308 each include eight data bits, Bit 0-Bit 7. In this example, each data bit within initialization register 306 and busy register 308 corresponds to an individual partition within SRAM cell module 302. For example, Bits 0 of initialization register 306 and busy register 308 correspond to Partition 0 310 of SRAM cell module 302. Other bits within the registers correspond to other partitions within SRAM cell module 302 accordingly.

In an example embodiment, initialization register 306 comprises non-volatile memory and is configurable by a user. In the example illustrated by FIG. 3, initialization register 306 contains data #BA$_{16}$ in hexadecimal and busy register 308 contains data #02$_{16}$ in hexadecimal In this example embodiment, initialization is a low-level hardware initialization providing performance improvements over CPU-based software selective initialization. Also, the initialization register is fetched from non-volatile (flash) memory during a read-only memory (ROM) boot code execution phase for use in the low-level hardware initialization process.

In this example embodiment, bits within initialization register 306 containing is correspond to partitions within SRAM cell module 302 which are to be initialized during boot-up while bits within initialization register containing 0s correspond to partitions within SRAM cell module 302 which are not to be initialized during boot-up. During boot-up, partitions within SRAM cell module 302 are sequentially initialized. In many embodiments, if the device were to attempt to initialize the entire SRAM cell module 302 at once, a substantial power drop would occur, potentially causing the system to fail.

Busy register 308 provides the ability to track which partition within SRAM cell module 302 is currently being initialized. Subsequent partitions are then initialized as each previous partition completes initialization. In this example, busy register 308 contains data #02$_{16}$ in hexadecimal indicating that Partition 1 311 of SRAM cell module 302 is currently undergoing initialization. Once initialization of Partition 1 311 is complete, busy register will be updated to data #00$_{16}$ in hexadecimal indicating that no partitions are currently undergoing initialization and that the next partition requiring initialization may be initialized.

Figure 4:
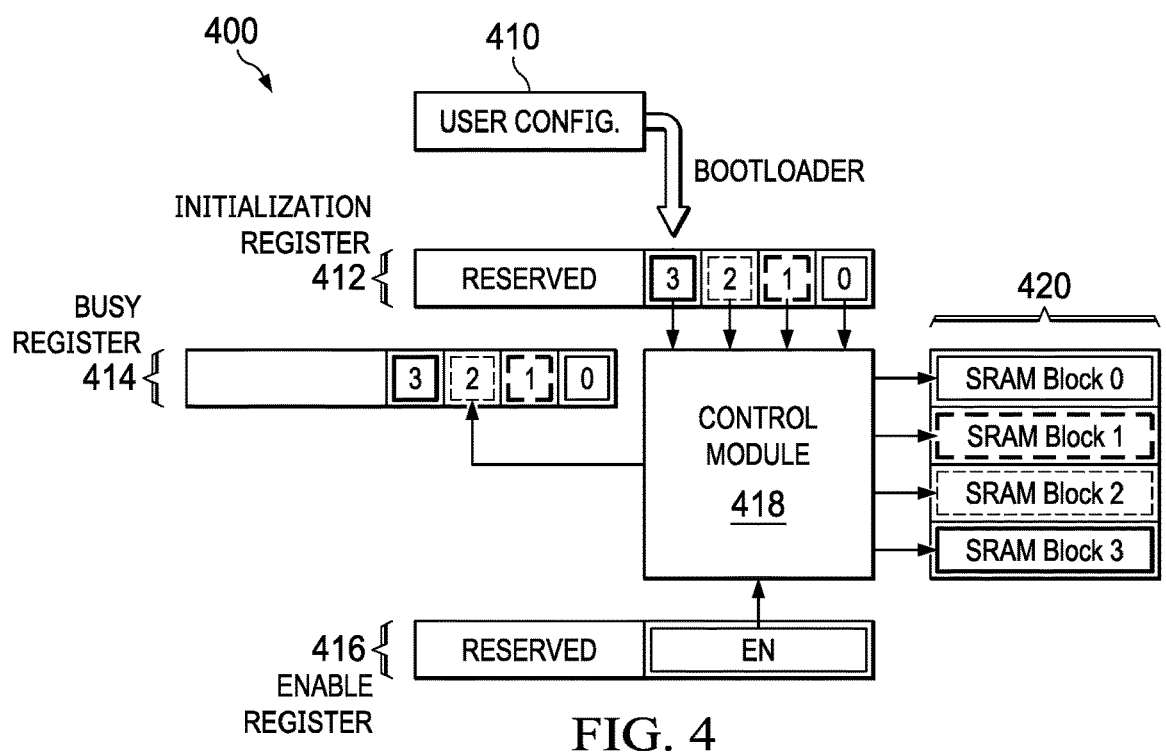
FIG. 4 illustrates a block diagram of an example embodiment of a static random-access memory including selective initialization.

FIG. 4 illustrates a block diagram of an example embodiment of a static random-access memory 400 including selective initialization. In this simplified block diagram, an example method for selectively initializing a SRAM is illustrated. Here, during boot-up, the bootloader fetches a user configuration from non-volatile (flash) memory 410 and sets bits within initialization register 412 accordingly. In this example embodiment, initialization register 412 does not need to be a non-volatile memory, since the user configuration is stored in other non-volatile memory then written into initialization register 412 during boot-up.

In this example embodiment, control module 418 reads initialization register 412 to determine which partitions within SRAM cell module 420 are to be initialized. Control module 418 also reads enable register 416 which enables control module 418 to begin the process of initialization.

Also, control modules reads and writes busy register 414 as discussed above to indicate which partition within SRAM cell module 420 is currently being initialized. Partitions requiring initialization are sequentially initialized in order to prevent large IR drops within SRAM cell module 420 during initialization. Various embodiments of the present invention use different initialization sequences all within the scope of the present invention. In some examples, initialization sequences are determined based on physical hardware constraints of the SRAM system and are not necessarily in bit order within initialization register 412.

Figure 5:
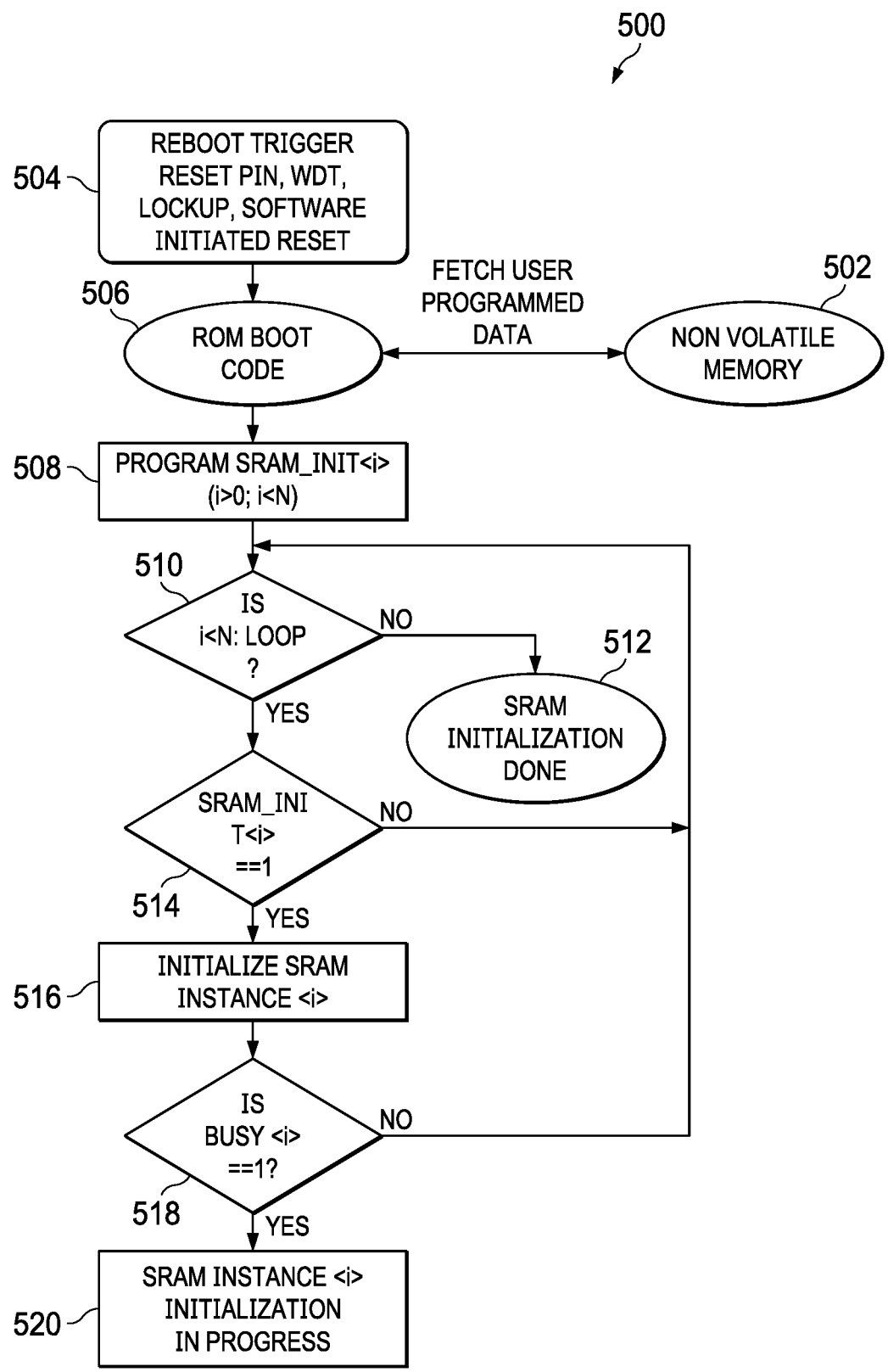
FIG. 5 illustrates a flow chart of an example embodiment of a method for selectively initializing a static random-access memory (SRAM) comprising a plurality of SRAM cell partitions.

FIG. 5 illustrates a flow chart of an example embodiment of a method 500 for selectively initializing a static random-access memory (SRAM) comprising a plurality of SRAM cell partitions. In this example, upon any one of a number of reset triggering events 504, the SRAM reboots and during boot-up the bootloader executes ROM boot code 506, fetches user programmed configuration data from non-volatile memory 502, and stores the initialization data in an initialization register SRAM_INIT 508.

In this example embodiment, initialization register SRAM_INIT contains N bits, each corresponding to a SRAM cell module partition. In a decision step 510, control logic first checks to see if the current bit <i> is less than N. If <i> is equal to N, then initialization is complete at operation 512. If <i> is less than N, decision step 514 check to see if the value of SRAM_INIT <i> is equal to 1 (indicating that the corresponding SRAM partition is to be initialized. If SRAM_INIT <i> is equal to one, the corresponding SRAM partition is initialized in operation 516 and the corresponding bit is set in the busy register during the initialization.

In decision step 518, the control module checks to see if busy <i> is set. If this bit is set, this indicates that initialization of SRAM partition <i> is currently in progress, and the control module waits for the initialization of the partition to complete. Once the busy register indicates that initialization of the current partition is complete, the control module increments <i> and returns to decision step 510.

Figure 6:
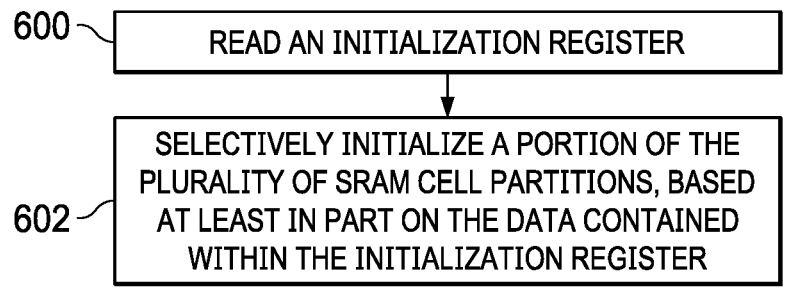
FIG. 6 illustrates a flow chart of an example embodiment of a method for selectively initializing a static random-access memory (SRAM) comprising a plurality of SRAM cell partitions.

FIG. 6 illustrates a flow chart of an example embodiment of a method for selectively initializing a static random-access memory (SRAM) comprising a plurality of SRAM cell partitions. In this example embodiment, a control module reads an initialization register containing data configured to control initialization of at least some of the plurality of SRAM cell partitions, (operation 600).

The control module then selectively initializes a portion of the plurality of SRAM cell partitions, based at least in part on the data contained within the initialization register, (operation 602).

Figure 7:
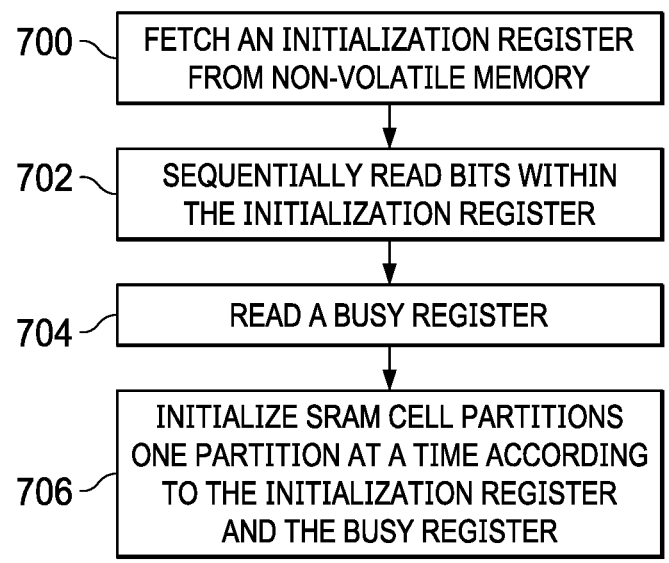
FIG. 7 illustrates a flow chart of an example embodiment of a method for selectively initializing a static random-access memory (SRAM) comprising a plurality of SRAM cell partitions.

FIG. 7 illustrates a flow chart of an example embodiment of a method for selectively initializing a static random-access memory (SRAM) comprising a plurality of SRAM cell partitions. In another example embodiment, during boot-up, a bootloader fetches a user configuration from non-volatile (flash) memory and sets bits within an initialization register accordingly, (operation 700).

A control module then sequentially reads bits within the initialization register to determine which SRAM cell partitions are to be initialized, (operation 702). The control module also reads a busy register to determine if any SRAM cell partitions are currently being initialized, (operation 704).

The control module initializes SRAM cell partitions one partition at a time according to the contents of the initialization register (indicating which partitions to initialize) and the busy register (indicating an active initialization), (operation 706).

Modifications are possible in the described examples, and other examples are possible within the scope of the claims.

What is claimed is:

1. A system, comprising:
   a static random-access memory (SRAM) cell module comprising a first SRAM cell partition and a second SRAM cell partition, wherein the first and second SRAM cell partitions each comprises a set of SRAM cells;
   an initialization register configured to include values to indicate whether or not the first and second SRAM cell partitions are to be initialized;
   a busy register configured to include values to indicate whether or not the first and second SRAM cell partitions are currently being initialized; and
   a control module configured to:
   obtain the values of the initialization register and busy register; and
   selectively initialize a portion of the SRAM cell module based at least in part on the values of the initialization register and busy register.

2. The system of claim 1, wherein the initialization of the portion of the SRAM cell module is a low-level hardware initialization of the SRAM.

3. The system of claim 1, wherein the busy register comprises a first bit and a second bit corresponding respectively to the first SRAM cell partition and the second SRAM cell partition, and wherein values of the first and second bits indicate respectively whether or not the corresponding SRAM cell partitions are currently being initialized.

4. The system of claim 1, wherein the initialization register comprises non-volatile memory.

5. The system of claim 1, wherein the initialization register is programmable by a user.

6. The system of claim 1, wherein the values of the initialization register are fetched from a non-volatile memory to the initialization register prior to that the control module obtains the values from the initialization register.

7. The system of claim 1, wherein the initialization register comprises a first bit and a second bit corresponding respectively to the first SRAM cell partition and the second SRAM cell partition, and wherein values of the first and second bits indicate respectively whether or not the corresponding SRAM cell partitions are to be initialized.

8. The system of claim 7, wherein to selectively initialize the portion of the SRAM cell module, the control module is configured to:
   initialize the first SRAM cell partition based on a determination that the value of the first bit of the initialization register is a first value, or not initialize the first SRAM cell partition based on a determination that the value of the first bit is a second value; and
   initialize the second SRAM cell partition based on a determination that the value of the second bit of the initialization register is a first value, or not initialize the second SRAM cell partition based on a determination that the value of the second bit is a second value.

9. The system of claim 7, wherein to selectively initialize the portion of the SRAM cell module, the control module is further configured to sequentially initialize the portion of the SRAM cell module.

10. The system of claim 9, wherein to sequentially initialize the portion of the SRAM cell module, the control module is configured to:
    obtain the value of the first bit of the initialization register;
    determine whether to initialize the first SRAM cell partition based on the value of the first bit;
    initialize the first SRAM cell partition based on a determination that the value of the first bit of the initialization register is a first value, or not initialize the first SRAM cell partition based on a determination that the value of the first bit is a second value; and
    subsequent to initialization or not initialization of the first SRAM cell partition based on the determination,
    obtain the value of the second bit of the initialization register; and
    determine whether to initialize the second SRAM cell partition based on the value of the second bit.

11. A method, comprising:
    obtaining, by a controller of a static random-access memory (SRAM), values from an initialization register, wherein the SRAM comprises a first and a second SRAM cell partitions each comprising a set of SRAM cells, and wherein the values of the initialization register indicate whether or not the first and second SRAM cell partitions are to be initialized;

obtaining, by the controller, values of a busy register, wherein the values of the busy register indicate whether or not the first and second SRAM cell partitions are currently being initialized; and selectively initialize, by the controller, a portion of the SRAM based at least in part on the values of the initialization register and busy register.

12. The method of claim 11, wherein the busy register comprises a first bit and a second bit corresponding respectively to the first SRAM cell partition and the second SRAM cell partition, and wherein values of the first and second bits indicate respectively whether or not the corresponding SRAM cell partitions are currently being initialized.

13. The method of claim 11, further comprising:
fetching the values of the initialization register from a non-volatile memory during execution of a read-only memory (ROM) boot code.

14. The method of claim 11, wherein the initialization register is a non-volatile memory.

15. The method of claim 11, wherein the initialization register comprises a first bit and a second bit corresponding respectively to the first SRAM cell partition and the second SRAM cell partition, and wherein values of the first and second bits indicate respective whether or not the corresponding SRAM cell partitions are to be initialized.

16. The method of claim 15, wherein selectively initializing the portion of the SRAM comprises:
initializing the first SRAM cell partition based on determining that the value of the first bit of the initialization register is a first value, or not initializing the first SRAM cell partition based on determining that the value of the first bit is a second value; and
initializing the second SRAM cell partition based on determining that the value of the second bit of the initialization register is a first value, or not initializing the second SRAM cell partition based on determining that the value of the second bit is a second value.

17. The method of claim 15, wherein selectively initializing the portion of the SRAM further comprises:
obtaining the values of the first and second bits sequentially from the initialization register; and
initializing one of the first and second SRAM cell partitions at a time according to the values of the first and second bits of the initialization register.

18. A system, comprising:
a hardware control module for a static random-access memory (SRAM), configured to:
read values from an initialization register, wherein the SRAM comprises a first and a second SRAM cell partitions each comprising a set of SRAM cells, and wherein the values of the initialization register indicate whether or not the first and second SRAM cell partitions are to be initialized;
read values of a busy register, wherein the values of the busy register indicate whether or not the first and second SRAM cell partitions are currently being initialized; and
selectively initialize a portion of the SRAM based at least in part on the values of the initialization register and busy register.

19. The system of claim 18, wherein the busy register comprises a first bit and a second bit corresponding respectively to the first SRAM cell partition and the second SRAM cell partition, wherein the values of the first and second bits indicate respectively whether or not the corresponding SRAM cell partitions are currently being initialized, and wherein the hardware control module is configured to refrain from initializing the second SRAM cell partition until a determination that the first SRAM cell partition is not currently being initialized based on the value of the first bit of the busy register.

20. The system of claim 18, wherein the values of the initialization register are stored in a non-volatile memory outside the initialization register, and fetched from the non-volatile memory to the initialization register during execution of a read-only memory (ROM) boot code.

21. The system of claim 18, wherein the initialization register comprises a first bit and a second bit corresponding respectively to the first SRAM cell partition and the second SRAM cell partition, and wherein values of the first and second bits indicate respective whether or not the corresponding SRAM cell partitions are to be initialized.

22. The system of claim 21, wherein the hardware control module is configured to:
sequentially read the values of the first and second bits within the initialization register; and
initialize one of the first and second SRAM cell partitions at a time according to the values of the first and second bits of the initialization register.

* * * * *